United States Patent
Lee et al.

(10) Patent No.: US 9,460,780 B2
(45) Date of Patent: Oct. 4, 2016

(54) INITIALIZATION TECHNIQUES FOR MULTI-LEVEL MEMORY CELLS USING MULTI-PASS PROGRAMMING

(71) Applicant: SanDisk Technologies Inc., Plano, TX (US)

(72) Inventors: Aaron Lee, Mountain View, CA (US); Mrinal Kochar, San Jose, CA (US); Abhijeet Bhalerao, San Jose, CA (US); Mikhail Palityka, Oakville (CA)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/600,675

(22) Filed: Jan. 20, 2015

(65) Prior Publication Data
US 2016/0211014 A1 Jul. 21, 2016

(51) Int. Cl.
*G11C 11/34* (2006.01)
*G11C 11/56* (2006.01)

(52) U.S. Cl.
CPC ........ *G11C 11/5628* (2013.01); *G11C 11/5642* (2013.01); *G11C 11/5621* (2013.01)

(58) Field of Classification Search
CPC .............. G11C 11/5628; G11C 16/10; G11C 16/3459; G11C 2211/5641; G11C 11/56; G11C 16/3436; G11C 2211/5643; G11C 2211/5621; G11C 2211/5642; G11C 2211/5644
See application file for complete search history.

(56) References Cited

U.S. PATENT DOCUMENTS

| 8,054,684 | B2 | 11/2011 | Gorobets et al. |
| 8,681,563 | B1* | 3/2014 | Lee .................... G11C 11/56 365/185.14 |
| 8,885,418 | B1 | 11/2014 | Chung et al. |
| 2010/0061151 | A1* | 3/2010 | Miwa .................. G11C 11/5628 365/185.17 |
| 2011/0153913 | A1* | 6/2011 | Huang ................ G11C 7/1042 711/103 |
| 2012/0155166 | A1 | 6/2012 | Li |

* cited by examiner

*Primary Examiner* — Son Dinh
*Assistant Examiner* — Uyen B Tran
(74) *Attorney, Agent, or Firm* — Vierra Magen Marcus LLP

(57) ABSTRACT

Methods are provided for programming multi-level non-volatile memory cells, the multi-level non-volatile memory cells accessible by a plurality of word lines. The methods include using a four-pass programming technique to program a block of the multi-level non-volatile memory cells, detecting a power cycle before completing programming of the block of the multi-level non-volatile memory cells, and upon power-up initialization, resuming programming on the block of the multi-level non-volatile memory cells.

20 Claims, 16 Drawing Sheets

|  | LM Pass | Foggy Pass | First Fine Pass | Second Fine Pass |
|---|---|---|---|---|
| WL0 | S1: LP(0.0) | S3: LP(0.0), LP(0.1) LP (0.2) | S6: LP(0.0), LP(0.1) LP (0.2) | S16: LP(0.0), LP(0.1) LP (0.2) |
| WL1 | S2: LP(1.0) | S5: LP(1.0), LP(1.1) LP (1.2) | S9: LP(1.0), LP(1.1) LP (1.2) | S17: LP(1.0), LP(1.1) LP (1.2) |
| WL2 | S4: LP(2.0) | S8: LP(2.0), LP(2.1) LP (2.2) | S12: LP(2.0), LP(2.1) LP (2.2) | S18: LP(2.0), LP(2.1) LP (2.2) |
| WL3 | S7: LP(3.0) | S11: LP(3.0), LP(3.1) LP (3.2) | S14: LP(3.0), LP(3.1) LP (3.2) | S19: LP(3.0), LP(3.1) LP (3.2) |
| WL4 | S10: LP(3.0) | S13: LP(3.0), LP(3.1) LP (3.2) | S15: LP(3.0), LP(3.1) LP (3.2) | S20: LP(4.0), LP(4.1) LP (4.2) |

FIG. 8A

Case 1: LM-Foggy-First Fine Stage (Open Block)

| WL | No Write Abort | | Write Abort Occurring During LM, Foggy or First Fine Pass | | | | | | |
|---|---|---|---|---|---|---|---|---|---|
| | WL Status | Read Status | WL Status | Read Status | WL Status | Read Status | WL Status | Read Status | |
| 0 | F1 | UECC | F1 | UECC | F1 | UECC | F1 | UECC | |
| 1 | F1 | UECC | F1 | UECC | F1 | UECC | F1 | UECC | |
| 2 | F1 | UECC | F1 (WA) | UECC | FY | UECC | FY | UECC | |
| 3 | FY | UECC | FY | UECC | FY (WA) | UECC | LM | UECC | |
| 4 | LM | UECC | LM | UECC | LM | UECC | LM (WA) | UECC | |
| 5 | Er | ERASE | Er | ERASE | Er | ERASE | Er | ERASE | |
| 6 | Er | ERASE | Er | ERASE | Er | ERASE | Er | ERASE | |
| 7 | Er | ERASE | Er | ERASE | Er | ERASE | Er | ERASE | |
| ... | ... | ... | ... | ... | ... | ... | ... | ... | |
| 126 | Er | ERASE | Er | ERASE | Er | ERASE | Er | ERASE | |
| 127 | Er | ERASE | Er | ERASE | Er | ERASE | Er | ERASE | |

Case 2: LM-Foggy-First Fine Stage (Closed Block)

| WL | No Write Abort | | Write Abort Occurring During LM, Foggy or First Fine Pass | | | | | |
|---|---|---|---|---|---|---|---|---|
| | WL Status | Read Status | WL Status | Read Status | WL Status | Read Status | WL Status | Read Status |
| 0 | F1 | UECC | F1 | UECC | F1 | UECC | F1 | UECC |
| 1 | F1 | UECC | F1 | UECC | F1 | UECC | F1 | UECC |
| 2 | F1 | UECC | F1 | UECC | F1 | UECC | F1 | UECC |
| 3 | F1 | UECC | F1 | UECC | F1 | UECC | F1 | UECC |
| 4 | F1 | UECC | F1 | UECC | F1 | UECC | F1 | UECC |
| 5 | F1 | UECC | F1 | UECC | F1 | UECC | F1 | UECC |
| ... | ... | ... | ... | ... | ... | ... | ... | ... |
| 124 | F1 | UECC | F1 | UECC | F1 | UECC | F1 | UECC |
| 125 | F1 | UECC | F1 (WA) | UECC | FY | UECC | FY | UECC |
| 126 | FY | UECC | FY | UECC | FY (WA) | UECC | LM | UECC |
| 127 | LM | UECC | LM | UECC | LM | UECC | LM (WA) | UECC |

Case 2: LM-Foggy-First Fine Stage (Closed Block) (cont'd)

| WL | No Write Abort | | Write Abort Occurring During LM, Foggy or First Fine Pass | | | |
|---|---|---|---|---|---|---|
| | WL Status | Read Status | WL Status | Read Status | WL Status | Read Status |
| 0 | F1 | UECC | F1 | UECC | F1 | UECC |
| 1 | F1 | UECC | F1 | UECC | F1 | UECC |
| 2 | F1 | UECC | F1 | UECC | F1 | UECC |
| 3 | F1 | UECC | F1 | UECC | F1 | UECC |
| 4 | F1 | UECC | F1 | UECC | F1 | UECC |
| 5 | F1 | UECC | F1 | UECC | F1 | UECC |
| ... | ... | ... | ... | ... | ... | ... |
| 124 | F1 | UECC | F1 | UECC | F1 | UECC |
| 125 | F1 | UECC | F1 | UECC | F1 | UECC |
| 126 | F1 | UECC | F1 (WA) | UECC | F1 | UECC |
| 127 | FY | UECC | FY | UECC | FY (WA) | UECC |

FIG. 9B2

Case 2: LM-Foggy-First Fine Stage (Closed Block) (cont'd)

| WL | No Write Abort | | Write Abort Occurring During LM, Foggy or First Fine Pass | |
|---|---|---|---|---|
| | WL Status | Read Status | WL Status | Read Status |
| 0 | F1 | UECC | F1 | UECC |
| 1 | F1 | UECC | F1 | UECC |
| 2 | F1 | UECC | F1 | UECC |
| 3 | F1 | UECC | F1 | UECC |
| 4 | F1 | UECC | F1 | UECC |
| 5 | F1 | UECC | F1 | UECC |
| ... | ... | ... | ... | ... |
| 124 | F1 | UECC | F1 | UECC |
| 125 | F1 | UECC | F1 | UECC |
| 126 | F1 | UECC | F1 | UECC |
| 127 | F1 | UECC | F1(WA) | UECC |

FIG. 9B3

| WL | Case 3: Second Fine Stage | | | |
|---|---|---|---|---|
| | No Write Abort | | Write Abort Occurring During Second Fine Pass | |
| | WL Status | Read Status | WL Status | Read Status |
| 0 | F2 | GOOD | F2 | GOOD |
| 1 | F2 | GOOD | F2 | GOOD |
| 2 | F2 | GOOD | F2 | GOOD |
| 3 | F2 | GOOD | F2 | GOOD |
| 4 | F2 | GOOD | F2 | GOOD |
| 5 | F2 | GOOD | F2 | GOOD |
| ... | ... | ... | ... | ... |
| 124 | F2 | GOOD | F2 | GOOD |
| 125 | F2 | GOOD | F2 | GOOD |
| 126 | F1 | UECC | F2 (WA) | UECC |
| 127 | F1 | UECC | F1 | UECC |

FIG. 9C

INITIALIZATION TECHNIQUES FOR MULTI-LEVEL MEMORY CELLS USING MULTI-PASS PROGRAMMING

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

In flash memory and EEPROM devices, a memory call can include a floating gate that is positioned above and insulated from a channel region in a semiconductor substrate, in a two-dimensional (2D) NAND configuration. The floating gate is positioned between source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned ON to permit conduction between its source and drain is controlled by the level of charge on the floating gate.

The ability to adjust the threshold voltage allows a floating-gate transistor to act as a data storage element or memory cell. In some cases, more than one data bit per memory cell (e.g., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates are referred to as a NAND string. In addition, ultra-high density storage devices have been proposed using a 3D stacked memory structure which is formed from an array of alternating conductive and dielectric layers. One example is the Bit Cost Scalable (BiCS) architecture. A memory hole is drilled in the layers, and a NAND string is formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

In recent years, NAND flash memory has been scaled to reduce cost per bit. However, as process geometries shrink, many design and process challenges are presented. These challenges include reduced charge storage capacity per memory cell and increased floating gate to floating gate coupling between adjacent memory cells.

BRIEF DESCRIPTION OF THE DRAWINGS

FIG. 8A depicts an embodiment of a programming sequence for a 3-bit memory.

FIG. 9A depicts example word line status and read status following a power cycle for a block partially programmed using an example LM-Foggy-Double Fine programming scheme.

FIG. 9B1-9B3 depict additional example word line status and read status following a power cycle for a block partially programmed using an example LM-Foggy-Double Fine programming scheme.

FIG. 9C depicts still additional example word line status and read status following a power cycle for a block partially programmed using an example LM-Foggy-Double Fine programming scheme.

DETAILED DESCRIPTION

Technology is described for multi-pass programming non-volatile memory cells. In a conventional multi-pass programming technique, if programming aborts (e.g., due to a power failure or an unexpected disruption) in the middle of programming a block, the partially programmed word lines are unreadable. Conventional power up initialization schemes following such a program abort typically rewrite the data for the whole block to a new block. But rewriting the block is time consuming, increases system write amplification, and can result in putting the memory system in a time out state.

In contrast to such conventional power up initialization schemes, a power up initialization scheme is described that continues where programming left off on the same block without having to rewrite previously written data to a new block. In particular, a memory system uses a four-pass programming technique to program a block of the multi-level non-volatile memory cells. If a power cycle occurs before completing programming of the block of the multi-level non-volatile memory cells, the memory system detects the power cycle, and upon power-up initialization, the memory system determines an error correction code (ECC) read status of each memory cell in the block, and based on the ECC read status, resumes programming on the block of the multi-level non-volatile memory cells.

Figure 1:
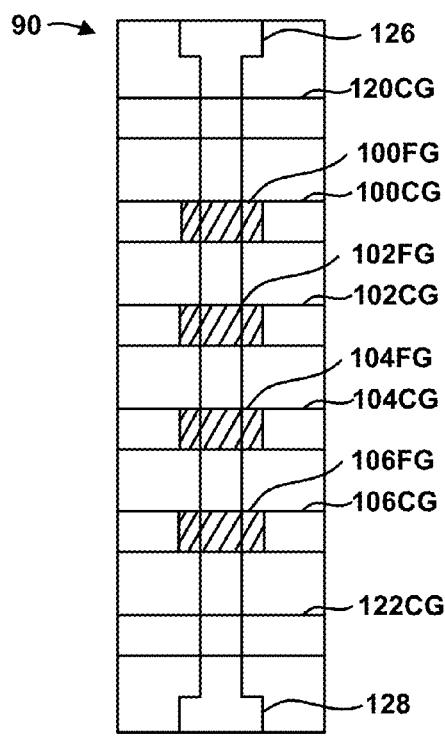
FIG. 1 depicts an embodiment of a NAND string.
Figure 2:
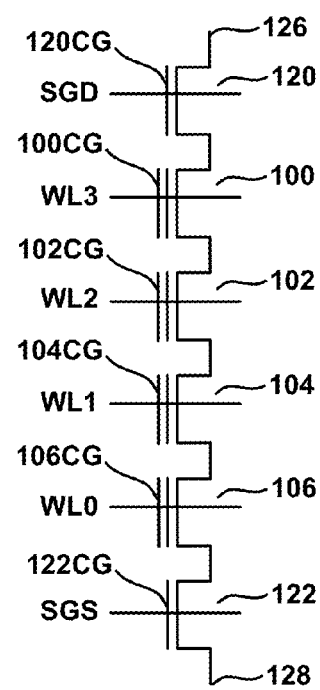
FIG. 2 depicts an equivalent circuit diagram for the NAND string of FIG. 1.

FIG. 1 depicts an embodiment of a NAND string 90, and FIG. 2 depicts an equivalent circuit diagram for NAND string 90. NAND string 90 includes four transistors, 100, 102, 104, and 106, in series between a first select gate 120 (e.g., a drain-side select gate) and a second select gate 122 (e.g., a source-side select gate). Select gate 120 connects the NAND string to a bit line 126. Select gate 122 connects the NAND string to a source line 128. Select gate 120 is controlled by applying the appropriate voltage to control gate 120CG (e.g., via select line SGD of FIG. 2). Select gate 122 is controlled by applying the appropriate voltage to control gate 122CG (e.g., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Although FIGS. 1 and 2 show four floating-gate transistors in NAND string 90, the use of four floating-gate transistors is only provided as an example. A NAND string can have less than or more than four floating-gate transistors (or memory cells). For example, some NAND strings may include 16 memory cells, 32 memory cells, 64 memory cells, 128 memory cells, etc. This discussion is not limited to any particular number of memory cells in a NAND string. In an embodiment, a NAND string include 66 memory cells, with 64 memory cells used to store data and two memory cells used as dummy memory cells because they do not store data. Moreover, although NAND technology using floating-gate transistors is described, this technology also may be used with other memory technologies including those that employ charge trapping, phase-change (e.g., chalcogenide materials), or state-change materials.

A typical architecture for a flash memory system using a NAND flash memory structure includes a plurality of NAND strings within a memory block. One important difference between flash memory and other type of memory is that a memory cell must be programmed from the erased state. That is, the floating gate must first be emptied of charge. Programming then adds a desired amount of charge back to the floating gate. Flash memory does not support removing a portion of the charge from the floating gate to go from a more programmed state to a lesser one.

Furthermore, erasing is to empty all the charges from the floating gate and generally takes appreciably time. For that reason, it is cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together.

In some cases, the NAND strings within a memory block may share a common well (e.g., a p-well). Each NAND string is connected to a common source line by its source select gate controlled by select line SGS and connected to its associated bit line by its drain select gate controlled by select line SGD. The use of the terms connect, connected, and connection can include a direct connection or an indirect connection. Typically, each bit line runs on top of an associated NAND string in a direction perpendicular to the word lines and is connected to a sense amplifier. Other types of non-volatile storage devices, in addition to NAND flash memory, also can be used.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) because the unselected storage element is inhibited or locked out from programming during a given programming iteration of a programming operation.

Generally, an appropriate amount of boosting should be used. If the boosting is too low, an inhibited storage element may experience program disturb, in which the threshold voltage of the storage element is raised to a next higher data state, or to a level at which the storage element cannot be accurately read. On the other hand, if boosting is too high, electromagnetic coupling effects can raise the threshold voltages of the selected storage elements excessively, resulting in undesirable widening of the threshold voltage distributions.

Figure 3:
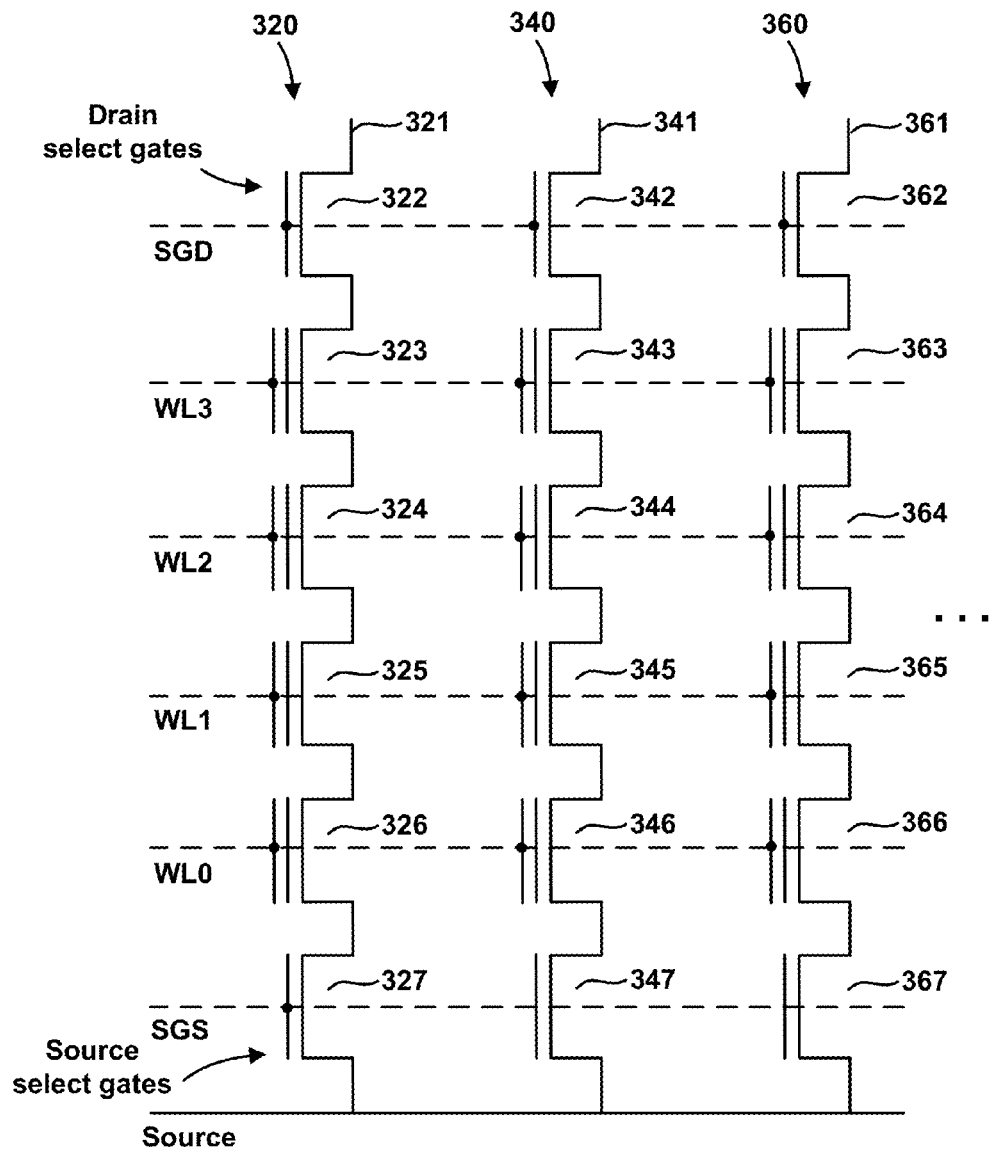
FIG. 3 depicts an embodiment of a memory block including a plurality of NAND strings.

FIG. 3 depicts a diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. Although four storage elements are illustrated for simplicity, NAND strings may have more or fewer than four storage elements.

NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD.

In other embodiments, the select lines do not necessarily need to be in common among the NAND strings. That is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366.

As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

Each storage element can store data. For example, when storing one bit of digital data, the range of possible threshold voltages (Vth) of the storage element is divided into two ranges which are assigned logical data "1" and "0." In an example of a NAND type flash memory, the Vth is negative after the storage element is erased, and defined as logic "1."

The Vth after a program operation is positive and defined as logic "0." When the Vth is negative and a read is attempted, the storage element will turn ON to indicate logic "1" is being stored. When the Vth is positive and a read operation is attempted, the storage element will not turn ON, which indicates that logic "0" is stored.

A storage element also can store multiple levels of information, for example, multiple bits of digital data. In this case, the range of Vth is divided into the number of levels of data. For example, if eight levels of information are stored, there will be eight Vth ranges assigned to the data values "000," "001," "010," "011," "100," "101," "110," and "111." In an example of a NAND type memory, the Vth after an erase operation is negative and defined as "111". Positive Vth values are used for the states of "000," "001," "010," "011," "100," "101," "110." The specific relationship between the data programmed into the storage element and the Vth ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the Vth of the storage element is increased. To apply the program voltage to the control gate of the storage element being programmed, that program voltage is applied on the appropriate word line. As discussed above, one storage element in each NAND string shares the same word line. For example, when programming storage element 324 of FIG. 3, the program voltage also will be applied to the control gates of storage elements 344 and 364.

Figure 4:
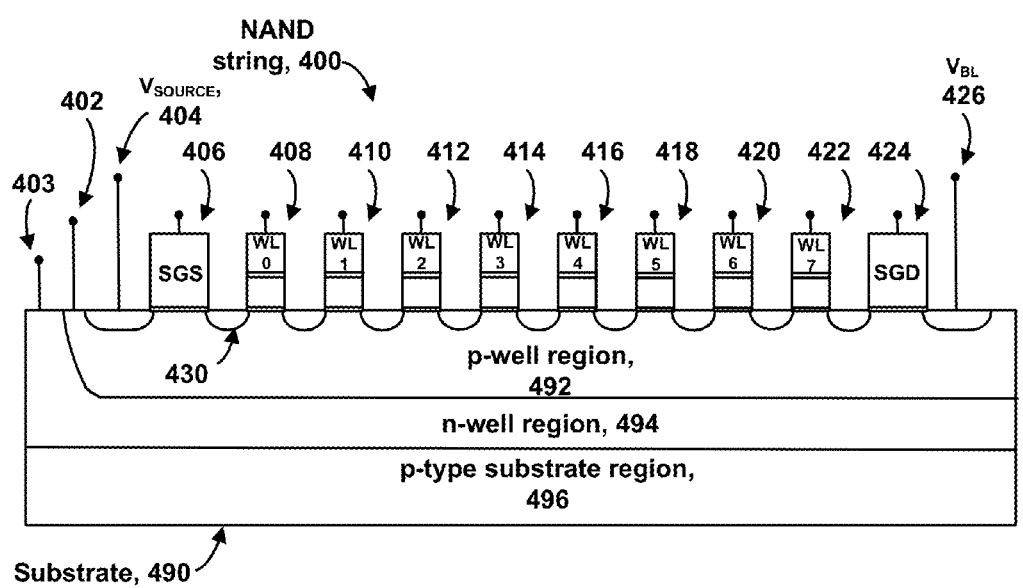
FIG. 4 depicts a cross-sectional view of a NAND string.

FIG. 4 depicts a cross-sectional view of a NAND string 400. The view is simplified and not to scale. NAND string 400 includes a source-side select gate 406, a drain-side select gate 424, and eight storage elements 408, 410, 412, 414, 416, 418, 420 and 422, formed on a substrate 490. The components can be formed on a p-well region 492 which itself is formed in an n-well region 494 of the substrate. The n-well can in turn be formed in a p-substrate 496. Supply lines 402 and 403 may communicate with the p-well region 492 and n-well region 494, respectively. A source supply line 404 with a potential of $V_{SOURCE}$ is provided in addition to a bit line 426 with a potential of $V_{BL}$. $V_{SGS}$ is applied to select gate 406 and $V_{SGD}$ is applied to select gate 424. The source side of a word line or non-volatile storage element refers to the side which faces the source end of the NAND string, e.g., at source supply line 404, whereas the drain side of a word line or non-volatile storage element refers to the side which faces the drain end of the NAND string, e.g., at bit line 426.

Figure 5:
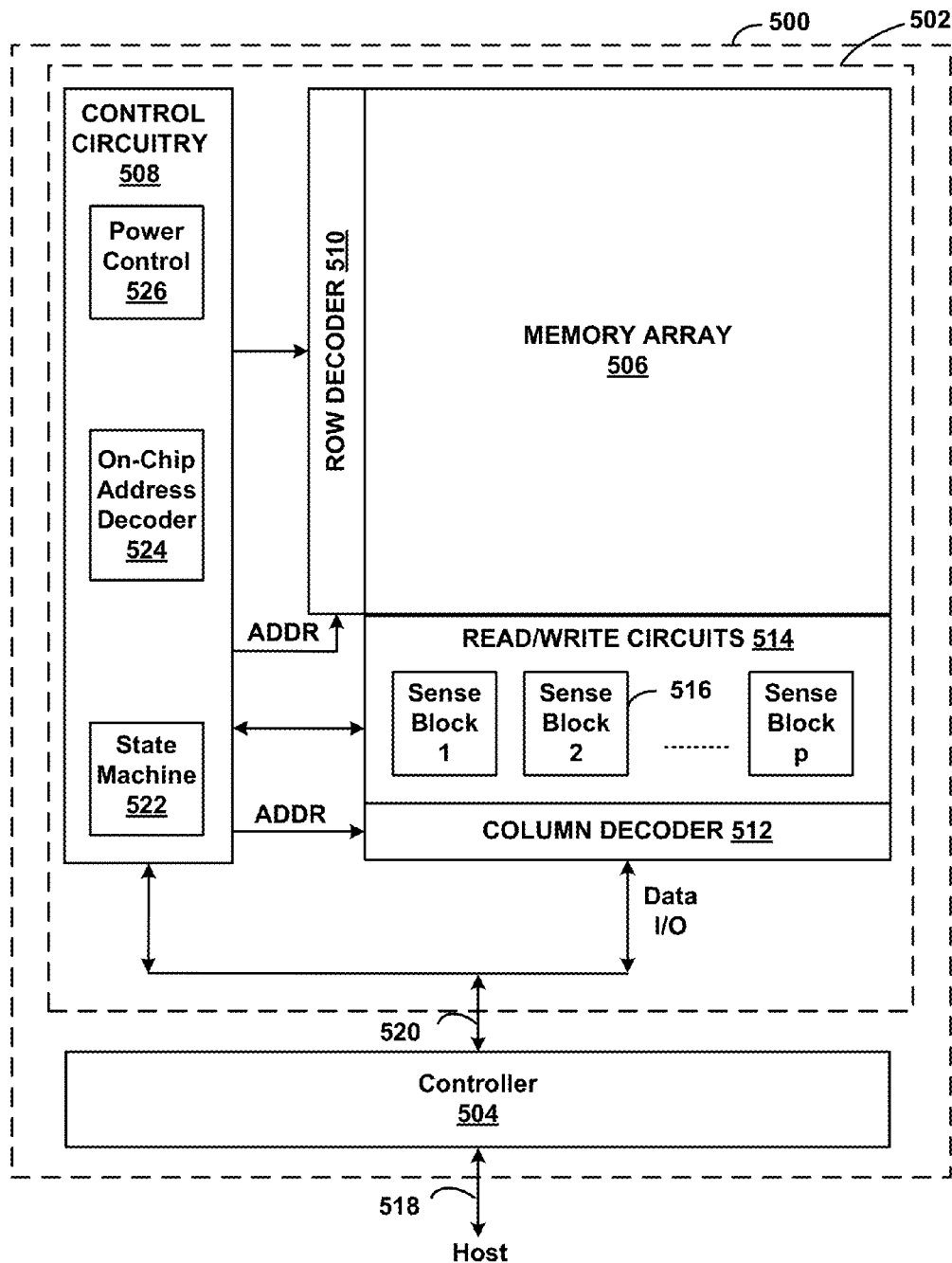
FIG. 5 depicts an embodiment of a non-volatile storage system including read/write circuits for reading and programming a page (or other unit) of memory cells.

FIG. 5 depicts an embodiment of a non-volatile storage system 500 including read/write circuits for reading and programming a page (or other unit) of memory cells (e.g., NAND multi-level cells) in parallel. As depicted, non-volatile storage system 500 includes a memory die 502 and controller 504. Memory die 502 includes a memory array 506 (e.g., a two-dimensional or three-dimensional array of storage elements), control circuitry 508, row decoder 510, column decoder 512, and read/write circuits 514.

In an embodiment, access to memory array 506 by the various peripheral circuits (e.g., row decoders or column decoders) is implemented in a symmetric fashion, on opposite sides of the array, so that the densities of access lines and circuitry on each side are reduced by half. Memory array 506 is addressable by word lines via row decoder 510 and by bit lines via column decoder 512. Word lines and bit lines are examples of memory array control lines. Read/write circuits 514 include multiple sense blocks 516 that allow a page of storage elements to be read or programmed in parallel. In some cases, controller 504 may be integrated on memory die 502. Commands and data are transferred between the host and controller 504 via lines 518 and between controller 504 and memory die 502 via lines 520.

Control circuitry 508 cooperates with read/write circuits 514 to perform memory operations on memory array 506. Control circuitry 508 includes a state machine 522, an on-chip address decoder 524, and a power control module 526. State machine 522 provides chip-level control of memory operations. On-chip address decoder 524 provides an address interface between that used by the host or a memory controller to the hardware address used by row decoder 510 and column decoder 512. Power control module 526 controls the power and voltages supplied to the word lines and bit lines during memory operations. In an embodiment, power control module 526 includes one or more charge pumps that can create voltages larger than the supply voltage.

In some embodiments, one or more of the components (alone or in combination), other than memory array 506, may be referred to as a managing or control circuit. For example, one or more managing or control circuits may include any one of or a combination of control circuitry 508, state machine 522, row decoder 510/column decoder 512, power control 526, sense blocks 516, read/write circuits 514, controller 504, and so forth. The one or more managing circuits may perform or facilitate one or more memory array operations including erasing, programming, or reading operations.

In one embodiment, memory array 506 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data).

Overhead data typically includes header information and ECCs that have been calculated from the user data of the sector. The controller (or other component) calculates the ECC when data is being programmed into the array, and also checks the ECC when data are being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
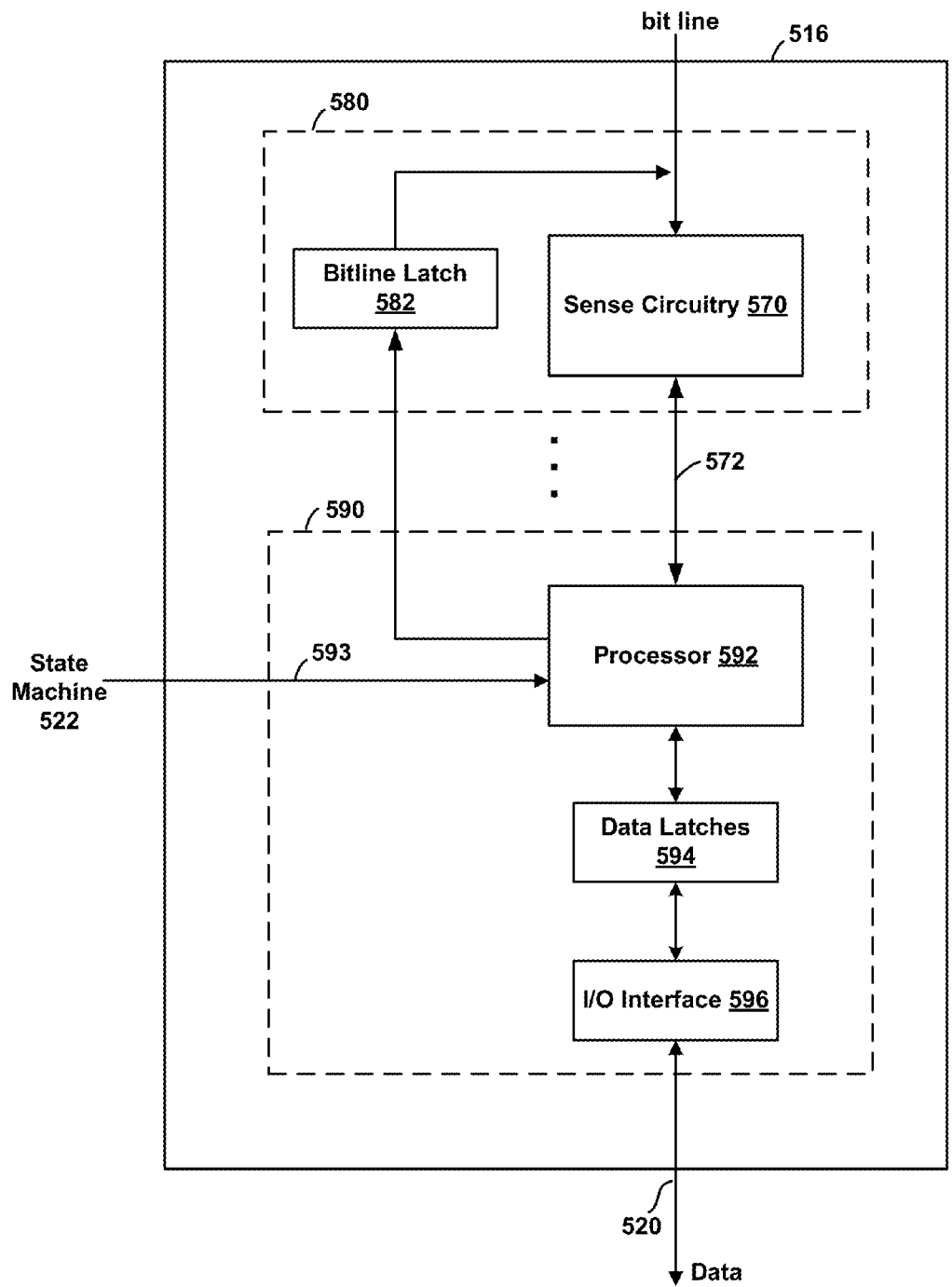
FIG. 6 depicts an embodiment of a sense block.

FIG. 6 depicts an embodiment of a sense block 516 of FIG. 5. An individual sense block 516 may be partitioned into a core portion, referred to as a sense module 580, and a common portion 590. In one embodiment, a separate sense module 580 is used for each bit line, and one common portion 590 is used for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches.

The set of data latches 594 may be used to store data bits determined by processor 592 during a read operation or to store data bits imported from the data bus 520 during a program operation. The imported data bits represent write data meant to be programmed into a memory array, such as memory array 506 in FIG. 5. I/O interface 596 provides an interface between data latches 594 and the data bus 520.

During a read operation or other storage element sensing operation, a state machine, such as state machine 522 of FIG. 5, controls the supply of different control gate voltages to the addressed storage elements. As state machine 522 steps through the various predefined control gate voltages corresponding to the various memory states supported by the memory, sense module 580 may trip at one of these voltages and an output will be provided from sense module 580 to processor 592 via bus 572.

At that point, processor 592 determines the resultant memory state by consideration of the tripping event(s) of sense module 580 and the information about the applied control gate voltage from state machine 522 via input lines 593. Processor 592 then computes a binary encoding for the memory state and stores the resultant data bits into data latches 594. In another embodiment of the core portion, bit line latch 582 serves both as a latch for latching the output of sense module 580 and as a bit line latch as described above.

During a programming operation, the data to be programmed are stored in the set of data latches 594. The programming operation, under the control of state machine 522, comprises a series of programming voltage pulses applied to the control gates of the addressed storage elements. Each program pulse is followed by a read back (or verify process) to determine if the storage element has been programmed to the desired memory state.

Processor 592 monitors the read back memory state relative to the desired memory state. When the two are in agreement, processor 592 sets the bit line latch 582 to cause the bit line to be pulled to a state designating program inhibit voltage. This inhibits the storage element coupled to the bit line from further programming even if program pulses appear on the control gate of the storage element. In other embodiments, processor 592 initially loads bit line latch 582 and sense circuitry 570 sets bit line latch 582 to an inhibit value during the verify process.

Data latch stack 594 contains a stack of data latches corresponding to sense module 580. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules is adapted so that each set of data latches will shift data in to or out of the data bus in sequence as if they are part of a shift register for the entire read/write block.

Figure 7A:
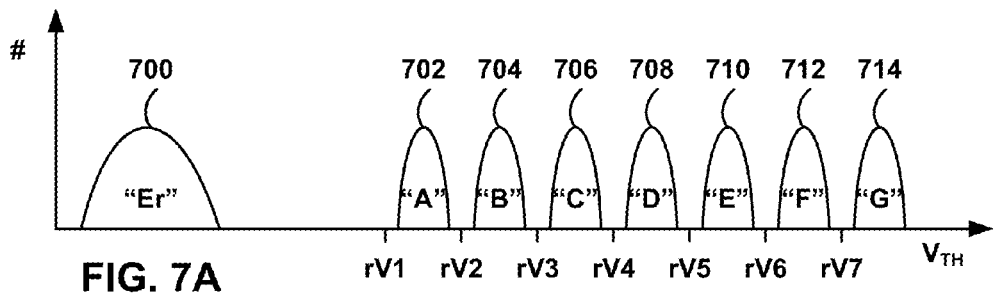
FIG. 7A depicts an embodiment of a set of threshold voltage distributions for an eight-state memory device in which each storage element stores three bits of data.

FIG. 7A depicts an embodiment of a set of threshold voltage distributions for an eight-state memory device in which each storage element stores three bits of data. Each memory cell has its threshold voltage window partitioned by at least seven demarcation levels into eight distinct zones. During a read operation, read demarcation levels rV1 to rV7 are used to determine to which zone the threshold voltage level of the cell lies. The cell is in an "erased" state if its threshold voltage is located in the lowest zone, and is in one of multiple "programmed" states if its threshold voltage is located in the upper zones.

Prior to programming, memory cells in a block are initially in the erased ("Er") state. FIG. 7A illustrates some of cells being programmed to a "programmed" state. A 3-bit code having lower, middle and upper bits can be used to represent each of the eight memory states. In an embodiment, the "Er," "A," "B," "C," "D," "E," "F" and "G" states are respectively represented by "111," "011," "001," "101," "100," "000," "010" and "110". Typically, programming is performed by application of one or more programming voltage pulses. After each pulse, the cell is sensed to verify if the threshold voltage has moved beyond a reference. A memory with such memory cell partitioning is referred to as "multi-state" memory or Multi-level Cell (MLC) memory.

A first Vth distribution 700 is provided for erased (Er-state) storage elements. Seven Vth distributions 702, 704, 706, 708, 710, 712 and 714 represent programmed states A, B, C, D, E, F and G, respectively. In one embodiment, the Vth distributions 700, 702, 704, 706, 708, 710, 712 and 714 are positive. In another embodiment, the Vth distribution 700 is negative, whereas the Vth distributions 702, 704, 706, 708, 710, 712 and 714 are positive.

Memory cells may be programmed in a full sequence programming technique, in which storage elements are programmed from the Er-state directly to any of the programmed states A, B, C, D, E, F and G. For example, a population of storage elements to be programmed may first be erased so that all storage elements in the population are in the Er-state. A series of program pulses may then be used to program storage elements directly into states A, B, C, D, E, F or G. While some storage elements are being programmed from the Er-state to the A-state, other storage elements are being programmed from the Er-state to the B-state, and so on.

The charge programmed into the charge storage element of one memory cell produces an electric field that perturbs the electric field of a neighboring memory cell. If a memory cell is program-verified under a first field environment and later is read again under a different field environment due to neighboring cells subsequently being programmed with different charges, the read accuracy may be affected by what is referred to as a floating-gate-to-floating gate coupling or the "Yupin Effect." With ever higher integration in semiconductor memories, the perturbation of the electric field due to the stored charges between memory cells (Yupin effect) becomes increasing appreciable as the inter-cellular spacing shrinks.

The Yupin effect can be mitigated by minimizing the asymmetry in field environment for a cell between the time of program-verifying and a time of reading subsequent to the neighboring cells have been programmed. This problem affects adjacent cells along a row and across bit lines (BL-BL Yupin effect) and along a column across word lines (WL-WL Yupin effect) of a memory array.

One way to reduce BL-BL Yupin effect is to perform multi-pass programming that avoids large change in charges between each pass of programming.

FIGS. 7B-7E depict an embodiment of a multi-pass programming technique (sometimes referred to as "LM-Foggy-Double Fine") for programming three bits of data into each memory cell of a page on a word line. In an embodiment, the LM-Foggy-Double Fine programming technique is a two-phased programming scheme that includes four programming passes. In the first phase, the first three programming passes (LM, Foggy and First Fine) are performed on an entire block of memory cells. The memory cell data are not readable for all three data pages after the first phase completes. In the second phase, the fourth programming pass (Second Fine) is performed on the same block. The memory cell data are readable for all three data pages only after the second phase completes.

In an embodiment, each memory cell stores data for three different pages: a lower page (L), a middle page (M) and an upper page (U). Eight data states may be depicted by repeating the threshold voltage distributions 700, 702, 704, 706, 708, 710, 712 and 7 from FIG. 7A. These states, and the bits they represent (UML), may comprise: Er-state (111), A-state (011), B-state (001), C-state (101), D-state (100), E-state (000), F-state (010) and G-state (110).

Thus, for Er-state, the upper, middle and lower pages store a "1." For A-state, the upper page stores a "0," and the middle and lower pages store a "1." For B-state, the upper and middle pages store "0," and the lower page stores "1." For C-state, the upper and lower pages store "1," and the middle page stores "0." For D-state, the upper page stores "1," and the middle and lower pages store "0." For E-state, the upper, middle and lower pages store "0." For F-state, the upper and lower pages store "0," and the middle page stores "1." For G-state, the upper and middle pages store "1," and the lower page stores "0." Note that although specific bit patterns have been assigned to each of the states, different bit patterns may also be assigned.

Figure 7B:
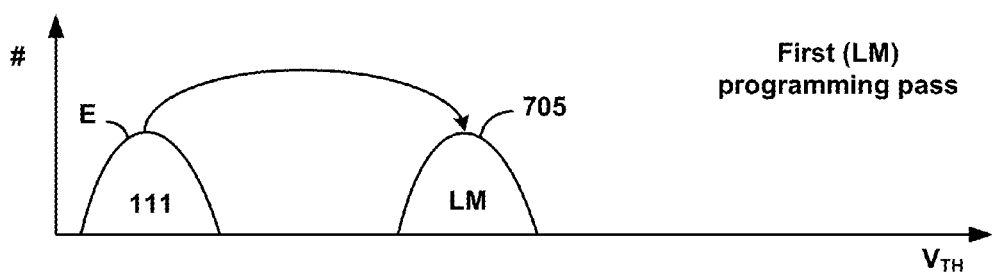
FIG. 7B depicts an embodiment of a first pass of a four-pass programming technique.

FIG. 7B illustrates an LM (or First) programming pass. The LM programming pass is a function only of lower page data. If the lower page bit L=1, memory cells in the ER-state remain in that state. If the lower page bit L=0, memory cells in the ER-state are programmed to the LM distribution 705.

Figure 7C:
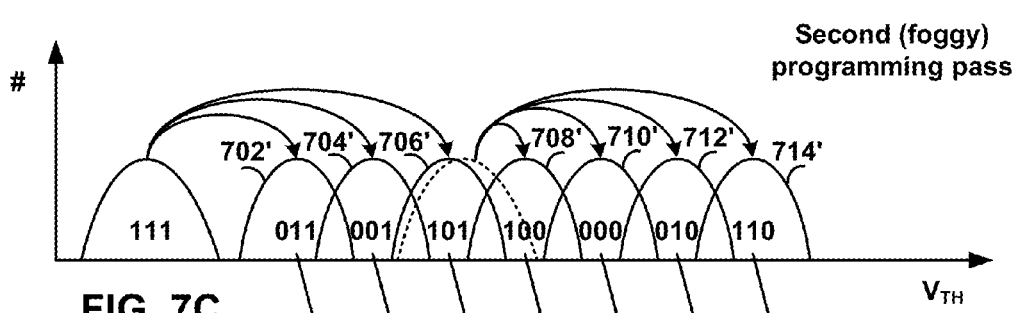
FIG. 7C depicts an embodiment of a second pass of the four-pass programming technique.

FIG. 7C illustrates a Foggy (or Second) programming pass. The Foggy programming pass is a function of all three pages of data. If the lower page bit L=1, and the middle and upper page bits M=U=1, memory cells in the ER-state remain in that state. If the lower and middle page bits L=M=1, and the upper page bit U=0, memory cells in the ER-state are programmed to the distribution 702'. If the lower page bit L=1, and the upper and middle page bits U=M=0, memory cells in the ER-state are programmed to the distribution 704'. If the lower and upper page bits L=U=1, and the middle page bit M=0, memory cells in the ER-state are programmed to the distribution 706'.

If the lower and middle page bits L=M=0, and the upper page bit U=1, memory cells in the LM-state are programmed to the distribution 708'. If the lower, middle and upper page bits L=M=U=0, memory cells in the LM-state are programmed to the distribution 710'. If the lower and upper page bits L=U=0, and the middle page bit M=1, memory cells in the LM-state are programmed to the distribution 712'. If the middle and upper page bits M=U=1, and the lower page bit L=0, memory cells in the LM-state are programmed to the distribution 714'. At the end of the Foggy programming pass, the memory cell has overlapping distributions, and the memory cell data cannot be read back reliably.

Figure 7D:
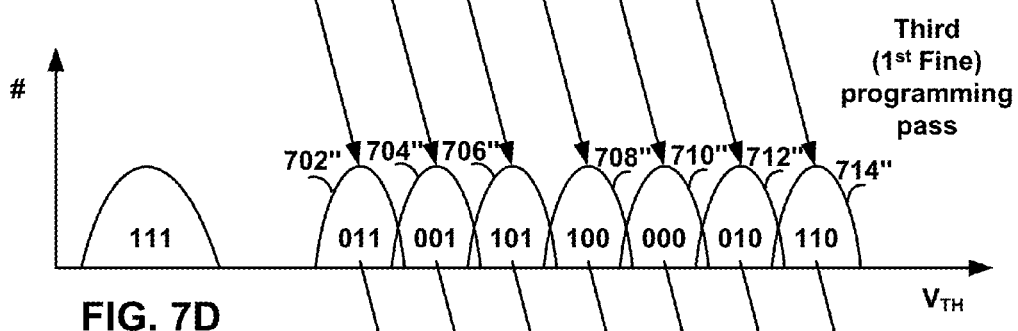
FIG. 7D depicts an embodiment of a third pass of the four-pass programming technique.

FIG. 7D illustrates a First Fine (or Third) programming pass. The First Fine programming pass is a function of all three pages of data. In the First Fine programming pass, the distributions are narrowed. Thus, distributions 702', 704', 706', 708', 710', 712' and 714' are narrowed to distributions 702", 704", 706", 708', 710", 712" and 714", respectively. At the end of the First Fine programming pass, although the distributions are narrower, the memory cell still has overlapping distributions, and the memory cell data cannot be read back reliably.

Figure 7E:
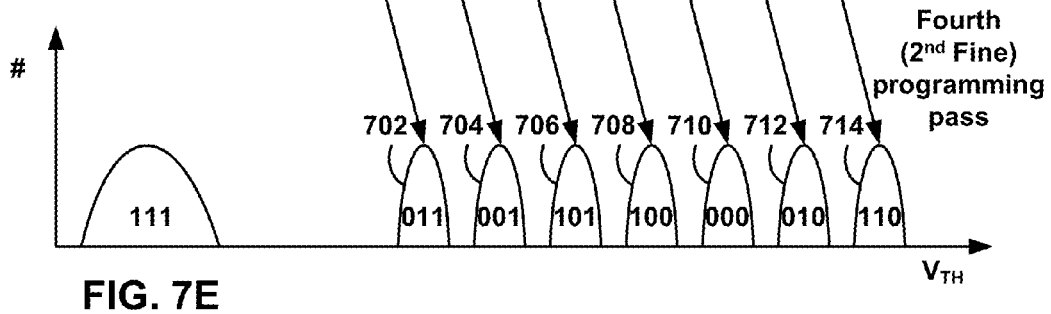
FIG. 7E depicts an embodiment of a fourth pass of the four-pass programming technique.

FIG. 7E illustrates a Second Fine (Or Fourth) programming pass. The Second Fine programming pass also is a function of all three pages of data. In the Second Fine programming pass, the distributions are further narrowed. Thus, distributions 702", 704", 706", 708', 710", 712" and 714" are narrowed to distributions 702, 704, 706, 708, 710, 712 and 714, respectively. After the Second Fine programming pass, the memory cell data are readable for all three data pages.

As for WL-WL Yupin effect where the perturbations are between memory cells on adjacent word lines, the WL-WL Yupin effect can be mitigated during programming using a predetermined programming scheme. For example, in the case of binary memory where every physical page holds a page of binary data, the pages are programmed sequentially along a consistent direction, such as from bottom to top. In this way, when a particular page is being programmed, the pages on the lower side of it are already programmed. Whatever perturbative effects they may have on the current page, they are being accounted for as the current page is being program-verified in view of these perturbations.

Essentially, the sequence of programming the page should allow the current page being programmed to see a minimum of changes around its environment after it has been programmed. Thus, each programmed page is only perturbed by the pages on the upper side of it, and the WL-WL Yupin effect is effectively reduced in half by this programming sequence. In the case of a memory where each physical page of memory cells is multi-state and the resulting multiple logical data pages are programmed in multiple programming passes, the sequence is less straightforward.

FIG. 8A illustrates an embodiment of a programming order for a memory having 3-bit memory cells (D3), with pages programmed in a sequence to minimize the Yupin effect between memory cells on adjacent word lines. To further minimize the Yupin effect between bit lines, the three logical pages are programmed by the LM-Foggy-Double Fine multi-pass programming technique described above with respect to FIGS. 7B-7E.

For convenience the notation is such that the physical pages P0, P1, P2, . . . reside on word lines WL0, WL1, WL2, . . . , respectively. For a 3-bit memory, each physical page has three logical pages associated with it, namely lower-bit, middle-bit and upper-bit logical pages, each with binary data. In general, a particular logical page is given by LP(WL#. logical_page#). For example, the lower-bit, middle-bit and upper-bit pages of P0 on W0 would respectively be labeled as LP(0.0), LP(0.1) and LP(0.2), the corresponding ones on WL2 would be LP(2.0), LP(2.1) and LP(2.2), and so on.

As described above, in an embodiment, the LM-Foggy-Double Fine multi-pass programming technique requires data from all three pages as program target data for the Foggy pass, the First Fine pass and the Second Fine pass. In addition, as described above, in an embodiment, the LM-Foggy-Double Fine programming technique is a two-phased programming scheme, in which the LM, Foggy and First Fine programming passes are performed on an entire block of memory cells in the first phase, and then the Second Fine programming pass is performed on the same block in the second phase.

In the example of FIG. 8A, the block includes memory cells on WL0-WL4. Thus, in the first phase, the LM, Foggy and First Fine programming passes are performed on WL0-WL4, and in the second phase the Second Fine programming pass is performed on WL0-WL4. The memory cell data are readable for all three data pages only after the Second Fine programming pass.

In the first phase, the LM, Foggy and First Fine programming passes are performed in a non-sequential word line programming order that follows a series of diagonal zigzag paths across the word lines in the table. In the second phase, the Second Fine programming pass is performed in a sequential word line programming order—that is, in a linear path down word lines in the table. In this example, after the LM, Foggy and First Fine programming passes are complete for word lines WL0-WL4 (steps S0-S15), the Second Fine programming pass is performed for word lines WL0-WL4 (steps S16-S20).

Figure 8B:
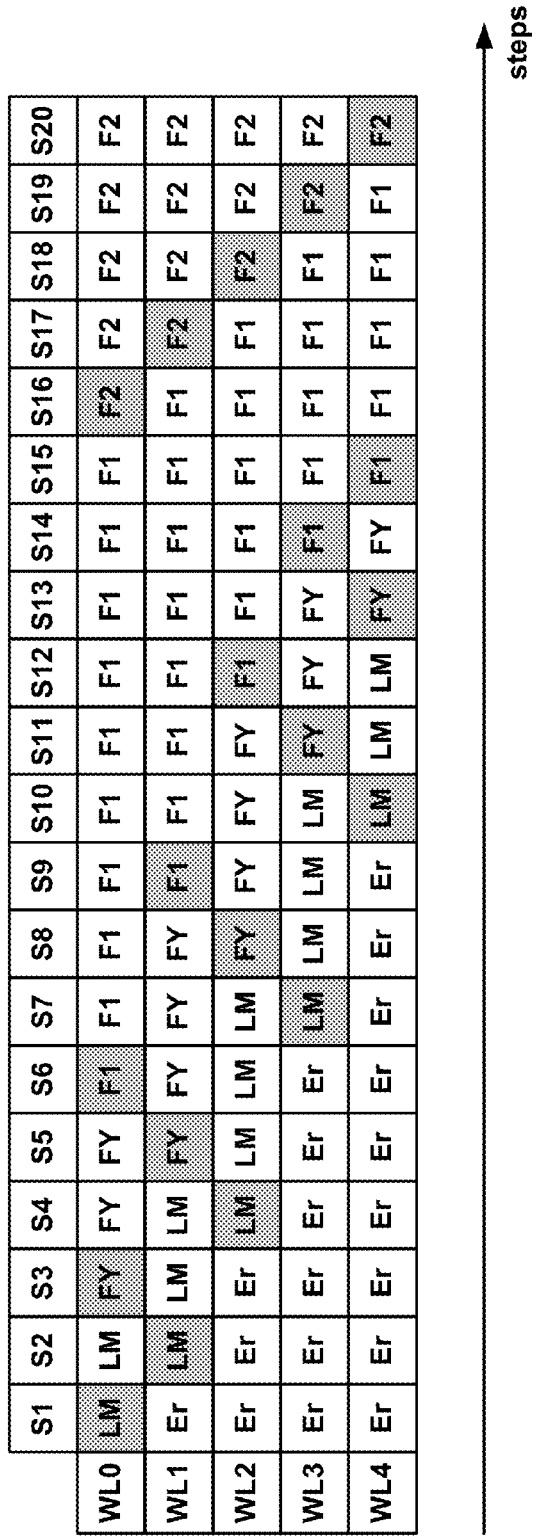
FIG. 8B is an alternative depiction of the programming sequence of FIG. 8A.

FIG. 8B illustrates an alternative view of the programming order for the 3-bit memory of FIG. 8A. In this view, the programming pass of each word line is listed at each step in the programming sequence, with LM=LM programming pass, FY=Foggy programming pass, F1=First Fine programming pass, and F2=Second Fine programming pass. The programming pass executed at each step is shown in highlight.

Thus, at step 51 the LM programming pass is performed on WL0. After step S1 is completed, the memory cells on WL0 have been programmed to the LM-state, and memory cells on WL1, WL2, WL3, WL4 remain in the erase Er-state. The memory cell data for all three data pages are not readable for any memory cell on any word line.

At step S2 the LM programming pass is performed on WL1. After step S2 is completed, the memory cells on WL0 and WL1 have been programmed to the LM-state, and memory cells on WL2, WL3, WL4 remain in the erase Er-state. The memory cell data for all three data pages are not readable for any memory cell on any word line.

At step S3 the Foggy programming pass is performed on WL0. After step S3 is completed, the memory cells on WL0 have been programmed to the Foggy-state, the memory cells on WL1 have been programmed to the LM-state, and memory cells on WL2, WL3, W4 remain in the erase Er-state. The memory cell data for all three data pages are not readable for any memory cell on any word line.

At step S4 the LM programming pass is performed on WL2. After step S4 is completed, the memory cells on WL0 have been programmed to the Foggy-state, the memory cells on WL1 and WL2 have been programmed to the LM-state, and memory cells on WL3, WL4 remain in the erase Er-state. The memory cell data for all three data pages are not readable for any memory cell on any word line.

At step S5 the Foggy programming pass is performed on WL1. After step S5 is completed, the memory cells on WL0 and WL1 have been programmed to the Foggy-state, the memory cells on WL2 have been programmed to the LM-state, and memory cells on WL3, WL4 remain in the erase Er-state. The memory cell data for all three data pages are not readable for any memory cell on any word line.

At step S6 the First Fine programming pass is performed on WL0. After step S6 is completed, the memory cells on WL0 have been programmed to the First Fine-state, the memory cells on WL1 have been programmed to the Foggy-state, the memory cells on WL2 have been programmed to the LM-state, and memory cells on WL3, WL4 remain in the erase Er-state. The memory cell data for all three data pages are not readable for any memory cell on any word line.

At step S7 the LM programming pass is performed on WL3. After step S7 is completed, the memory cells on WL0 have been programmed to the First Fine-state, the memory cells on WL1 have been programmed to the Foggy-state, the memory cells on WL2 and WL3 have been programmed to the LM-state, and memory cells on WL4 remain in the erase Er-state. The memory cell data for all three data pages are not readable for any memory cell on any word line.

At step S8 the Foggy programming pass is performed on WL2. After step S8 is completed, the memory cells on WL0 have been programmed to the First Fine-state, the memory cells on WL1 and WL2 have been programmed to the Foggy-state, the memory cells on WL3 have been programmed to the LM-state, and memory cells on WL4 remain in the erase Er-state. The memory cell data for all three data pages are not readable for any memory cell on any word line.

At step S9 the First Fine programming pass is performed on WL1. After step S9 is completed, the memory cells on WL0 and WL1 have been programmed to the First Fine-state, the memory cells on WL2 have been programmed to the Foggy-state, the memory cells on WL3 have been programmed to the LM-state, and memory cells on WL4 remain in the erase Er-state. The memory cell data for all three data pages are not readable for any memory cell on any word line.

At step S10 the LM programming pass is performed on WL4. After step S10 is completed, the memory cells on WL0 and WL1 have been programmed to the First Fine-state, the memory cells on WL2 have been programmed to the Foggy-state, and the memory cells on WL3 and WL4 have been programmed to the LM-state. The memory cell data for all three data pages are not readable for any memory cell on any word line.

At step S11 the Foggy programming pass is performed on WL3. After step S11 is completed, the memory cells on WL0 and WL1 have been programmed to the First Fine-state, the memory cells on WL2 and WL3 have been programmed to the Foggy-state, and the memory cells on WL4 have been programmed to the LM-state. The memory cell data for all three data pages are not readable for any memory cell on any word line.

At step S12 the First Fine programming pass is performed on WL2. After step S12 is completed, the memory cells on WL0-WL2 have been programmed to the First Fine-state, the memory cells on WL3 have been programmed to the Foggy-state, and the memory cells on WL4 have been programmed to the LM-state. The memory cell data for all three data pages are not readable for any memory cell on any word line.

At step S13 the Foggy programming pass is performed on WL4. After step S13 is completed, the memory cells on WL0-WL2 have been programmed to the First Fine-state, and the memory cells on WL3 and WL4 have been programmed to the Foggy-state. The memory cell data for all three data pages are not readable for any memory cell on any word line.

At step S14 the First Fine programming pass is performed on WL3. After step S14 is completed, the memory cells on WL0-WL3 have been programmed to the First Fine-state, and the memory cells on WL4 have been programmed to the Foggy-state. The memory cell data for all three data pages are not readable for any memory cell on any word line.

At step S15 the First Fine programming step is performed on WL4. After step S15 is completed, the memory cells on WL0-WL4 have been programmed to the First Fine-state. The memory cell data for all three data pages are not readable for any memory cell on any word line.

In this embodiment, the block consists of memory cells on WL0-WL4. Thus, at the end of step S15, the first phase of the example LM-Foggy-Double Fine programming scheme has completed on the block of memory cells on WL0-WL4. The second phase of the example LM-Foggy-Double Fine programming scheme begins at step S16.

At step S16 the Second Fine programming pass is performed on WL0. After step S16 is completed, the memory cells on WL0 have been programmed to the Second Fine-state, and the memory cells on WL1-WL4 have been programmed to the First Fine-state. The memory cell data on WL0 are readable for all three data pages, but the memory cell data on WL1-WL4 remain unreadable.

At step S17 the Second Fine programming pass is performed on WL1. After step S17 is completed, the memory cells on WL0 and WL1 have been programmed to the Second Fine-state, and the memory cells on WL2-WL4 have been programmed to the First Fine-state. The memory cell data on WL0 and WL1 are readable for all three data pages, but the memory cell data on WL2-WL4 remain unreadable.

At step S18 the Second Fine programming pass is performed on WL2. After step S18 is completed, the memory cells on WL0-WL2 have been programmed to the Second Fine-state, and the memory cells on WL3-WL4 have been programmed to the First Fine-state. The memory cell data on WL0-WL2 are readable for all three data pages, but the memory cell data on WL3-WL4 remain unreadable.

At step S19, the Second Fine programming pass is performed on WL3. After step S19 is completed, the memory cells on WL0-WL3 have been programmed to the Second Fine-state, and the memory cells on WL4 have been programmed to the First Fine-state. The memory cell data on WL0-WL3 are readable for all three data pages, but the memory cell data on WL4 remain unreadable.

At step S20, the Second Fine programming pass is performed on WL4. After step S20 is completed, the memory cells on WL0-WL4 have been programmed to the Second Fine-state. The memory cell data on WL0-WL4 are readable for all three data pages. Thus, after step S20, the memory cell data on the entire block of memory cells on WL0-WL4 are readable for all three data pages.

To ensure error-free data, flash memory typically uses an ECC to correct errors. Referring again to FIG. 5, in an embodiment, controller 504 includes an ECC processor (not shown). As data are received from a host, a page of data is staged in controller 504 and an ECC is computed by the ECC processor. The data page incorporating the ECC is then written to memory array 506.

Typically, when the data page is read, controller 504 compares the data page's existing ECC to a second version of the ECC computed on the read data. The ECC typically includes an error detection code (EDC) for rapid detection of any error in the data page. If the EDC indicates the existence of any error in the read data page, the ECC is invoked to correct erroneous bits in the read data page. The ECC is designed to correct up to a predetermined maximum number of errors. In practice, at any given time in the life of a memory, the ECC may have budget to correct a predetermined number of errors less than the predetermined maximum.

Table 1, below, lists the possible status of a page in D3. As described earlier, the ECC is designed to correct a predetermined number of errors in a page. The status of a page of data can be one of the following:

TABLE 1

| Page Status | |
| --- | --- |
| Page Status | Description |
| CECC | Correctable by ECC. The number of errors in all 3 data pages is correctable as it is within the capability of the ECC. However, the quality of the data is good only if the errors are below a predetermine threshold. |
| UECC | Uncorrectable by ECC. The number of errors either exceeds the capability of the ECC or above the predetermined threshold even though still correctable by ECC. The data are invalid. |
| GOOD | All 3 data pages of the word line have errors correctable by ECC and below a predetermined threshold. The data are valid. |
| ERASED | No data page has more than a predetermined number of cells in non-erased state. |

From the description above, any partially programmed erase blocks using multi-pass programming involving the combination of the LM-Foggy-Double Fine programming and non-sequential word line programming order will at any one time result in several word lines having less than all three logical pages programmed. Because LM-Foggy-Double Fine programming requires completion of the Second Fine programming pass before the data are readable, if programming were to abort (e.g., due to a power failure or an unexpected disruption) in the middle of programming a block, these partially programmed word lines will be unreadable.

Conventional power up initialization schemes following such a program abort typically rewrite the data for the whole block to a new block. Rewriting the block is time consuming, increases system write amplification, and can result in putting the memory system in a time out state. It is desirable in a power up initialization scheme to be able to continue where programming left off on the same block without having to rewrite previously written data to a new block.

A partially programmed word line will read back with a UECC error after completing the LM, Foggy and First Fine programming passes for that word line, as well as after a write abort during any of the four passes in the LM-Foggy-Double Fine programming scheme. This represents a problem to do partial block programming with possible power cycles between program segments, because there is no mechanism to determine if an intermediate program segment completed normally, or if a write abort occurred due to sudden power loss.

For the LM-Foggy-Double Fine programming scheme described above, a program abort in the middle of programming a block may occur in any of the following three cases:

(1) a power cycle occurs during the first phase of the LM-Foggy-Double Fine programming scheme, with some word lines in the erase state, (2) a power cycle occurs during the first phase of the LM-Foggy-Double Fine programming scheme, with no word lines in the erase state, and (3) a power cycle occurs during the second phase of the LM-Foggy-Double Fine programming scheme, and before the second phase is completed for all word lines. Each of these will be discussed with respect to FIGS. 9A-9C, which illustrate example memory status data following a program abort during LM-Foggy-Double Fine programming a 128 word line block.

FIG. 9A illustrates the first case described above: a power cycle occurs during the first phase of the LM-Foggy-Double Fine programming scheme, with some word lines in the erase state. In particular, FIG. 9A depicts example word line status and associated ECC read status for a programming block in two different scenarios: (1) a power cycle occurs after an intermediate program segment completed normally (i.e., no write abort), and (2) a power cycle occurs during an LM, Foggy of First Fine programming pass (i.e., write abort).

In the "No Write Abort" example depicted in FIG. 9A, memory cells on WL0-WL2 have been programmed to the First Fine-state, memory cells on WL3 have been programmed to the Foggy-state, memory cells on WL4 have been programmed to the LM-state, and memory cells on WL5-WL127 are in the Er-state. Persons of ordinary skill in the art will understand that the programming states shown in FIG. 9A are just examples, and a power cycle may occur after any intermediate program segment completed on any word line. In the illustrated example, memory cells on partially programmed WL0-WL4 will read back with a UECC error, and memory cells on WL5-WL127 read back with ERASE.

FIG. 9A depicts three different "Write Abort" examples, with write aborts occurring during the LM, Foggy and First Fine programming passes. In a first example, memory cells on WL0-WL1 have been programmed to the First Fine-state, memory cells on WL3 have been programmed to the Foggy-state, memory cells on WL4 have been programmed to the LM-state, memory cells on WL5-WL127 are in the Er-state, and a write abort occurs during the First Fine programming pass on WL2. In the illustrated example, memory cells on partially programmed WL0-WL4 will read back with a UECC error, and Memory cells on WL5-WL127 read back with ERASE.

In a second example, memory cells on WL0-WL1 have been programmed to the First Fine-state, memory cells on WL2 have been programmed to the Foggy-state, memory cells on WL4 have been programmed to the LM-state, memory cells on WL5-WL127 are in the Er-state, and a write abort occurs during the Foggy programming pass on WL3. In the illustrated example, memory cells on partially programmed WL0-WL4 will read back with a UECC error, and Memory cells on WL5-WL127 read back with ERASE.

In a third example, memory cells on WL0-WL1 have been programmed to the First Fine-state, memory cells on WL2 have been programmed to the Foggy-state, memory cells on WL3 have been programmed to the LM-state, memory cells on WL5-WL127 are in the Er-state, and a write abort occurs during the LM programming pass on WL4. In the illustrated example, memory cells on partially programmed WL0-WL4 will read back with a UECC error, and Memory cells on WL5-WL127 read back with ERASE.

Thus, as depicted in FIG. 9A, the ECC read statuses for the "No Write Abort" example and the three "Write Abort" examples are identical, and thus there is no way to determine if an intermediate program segment completed normally, or if a write abort occurred due to sudden power loss. Further, if a write abort occurred, the ECC read status data cannot be used to determine where the write abort occurred.

FIGS. 9B1-9B3 illustrate the second case described above: a power cycle occurs during the first phase of the LM-Foggy-Double Fine programming scheme, with no word lines in the erase state. In particular, FIGS. 9B1-9B3 each depict example word line status and associated ECC read status for a programming block in two different scenarios: (1) a power cycle occurs after an intermediate program segment completed normally (i.e., no write abort), and (2) a power cycle occurs during an LM, Foggy of First Fine programming pass (i.e., write abort).

FIGS. 9B1-9B3 depict three different "No Write Abort" examples. In a first example in FIG. 9B1, memory cells on WL0-WL125 have been programmed to the First Fine-state, memory cells on WL126 have been programmed to the Foggy-state, memory cells on WL127 have been programmed to the LM-state. In a second example depicted in FIG. 9B2, memory cells on WL0-WL126 have been programmed to the First Fine-state, memory cells on WL127 have been programmed to the Foggy-state. In a third example depicted in FIG. 9B3, memory cells on WL0-WL127 have been programmed to the First Fine-state. Persons of ordinary skill in the art will understand that the programming states shown in FIGS. 9B1-9B3 are just examples, and a power cycle may occur after any intermediate program segment completed on any word line. In the illustrated examples, memory cells on partially programmed WL0-WL127 will all read back with a UECC error.

FIGS. 9B1-9B3 depict six different "Write Abort" examples, with write aborts occurring during the LM, Foggy and First Fine programming passes. In a first example in FIG. 9B1, memory cells on WL0-WL124 have been programmed to the First Fine-state, memory cells on WL126 have been programmed to the Foggy-state, memory cells on WL127 have been programmed to the LM-state, and a write abort occurs during the First Fine programming pass on WL125. In the illustrated example, memory cells on partially programmed WL0-WL127 will read back with a UECC error.

In a second example in FIG. 9B1, memory cells on WL0-WL124 have been programmed to the First Fine-state, memory cells on WL125 have been programmed to the Foggy-state, memory cells on WL127 have been programmed to the LM-state, and a write abort occurs during the Foggy programming pass on WL126. In the illustrated example, memory cells on partially programmed WL0-WL127 will read back with a UECC error.

In a third example in FIG. 9B1, memory cells on WL0-WL124 have been programmed to the First Fine-state, memory cells on WL125 have been programmed to the Foggy-state, memory cells on WL126 have been programmed to the LM-state, and a write abort occurs during the LM programming pass on WL127. In the illustrated example, memory cells on partially programmed WL0-WL127 will read back with a UECC error.

In the fourth example in FIG. 9B2, memory cells on WL0-WL125 have been programmed to the First Fine-state, memory cells on WL127 have been programmed to the Foggy-state, and a write abort occurs during the First Fine programming pass on WL126. In the illustrated example, memory cells on partially programmed WL0-WL127 will read back with a UECC error.

In the fifth example in FIG. 9B2, memory cells on WL0-WL126 have been programmed to the First Fine-state, and a write abort occurs during the Foggy programming pass on WL127. In the illustrated example, memory cells on partially programmed WL0-WL127 will read back with a UECC error.

In the sixth example in FIG. 9B3, memory cells on WL0-WL126 have been programmed to the First Fine-state, and a write abort occurs during the First Fine programming pass on WL127. In the illustrated example, memory cells on partially programmed WL0-WL127 will read back with a UECC error.

Thus, as depicted in FIGS. 9B1-9B3, the ECC read statuses for the three different "No Write Abort" examples and the six different "Write Abort" examples are identical, and thus there is no way to determine if an intermediate program segment completed normally, or if a Write Abort occurred due to sudden power loss. Further, if a write abort occurred, the ECC read status data cannot be used to determine where the write abort occurred.

FIG. 9C illustrates the third case described above: a power cycle occurs during the second phase of the LM-Foggy-Double Fine programming scheme, and before the second phase is completed for all word lines. In particular, FIG. 9C depicts example word line status and associated ECC read status for a programming block in two different scenarios: (1) a power cycle occurs after an intermediate program segment completed normally (i.e., no write abort), and (2) a power cycle occurs during a Second Fine programming pass (i.e., write abort).

In the "No Write Abort" example depicted in FIG. 9C, memory cells on WL0-WL125 have been programmed to the Second Fine-state, and memory cells on WL126-WL127 are in the First Fine-state. Persons of ordinary skill in the art will understand that the programming states shown in FIG. 9C are just examples, and a power cycle may occur after any intermediate program segment completed on any word line. In the illustrated example, memory cells on fully programmed WL0-WL125 read back as GOOD, and memory cells on WL126-WL127 read back with a UECC error.

FIG. 9C depicts a "Write Abort" example, with a write abort occurring during the Second Fine programming pass. In the example, memory cells on WL0-WL125 have been fully programmed to the Second Fine-state, memory cells on WL127 have been programmed to the First Fine-state, and a write abort occurs during the Second Fine programming pass on WL126. In the illustrated example, memory cells on fully programmed WL0-WL125 read back as GOOD, and memory cells on WL126-WL127 read back with a UECC error.

Thus, as depicted in FIG. 9C, the ECC read statuses for the "No Write Abort" example and the "Write Abort" example are identical, and thus there is no way to determine if an intermediate program segment completed normally, or if a Write Abort occurred due to sudden power loss. Further, if a write abort occurred, the ECC read status data cannot be used to determine if the write abort occurred in a First Fine programming pass or a Second Fine programming pass.

Figure 10:
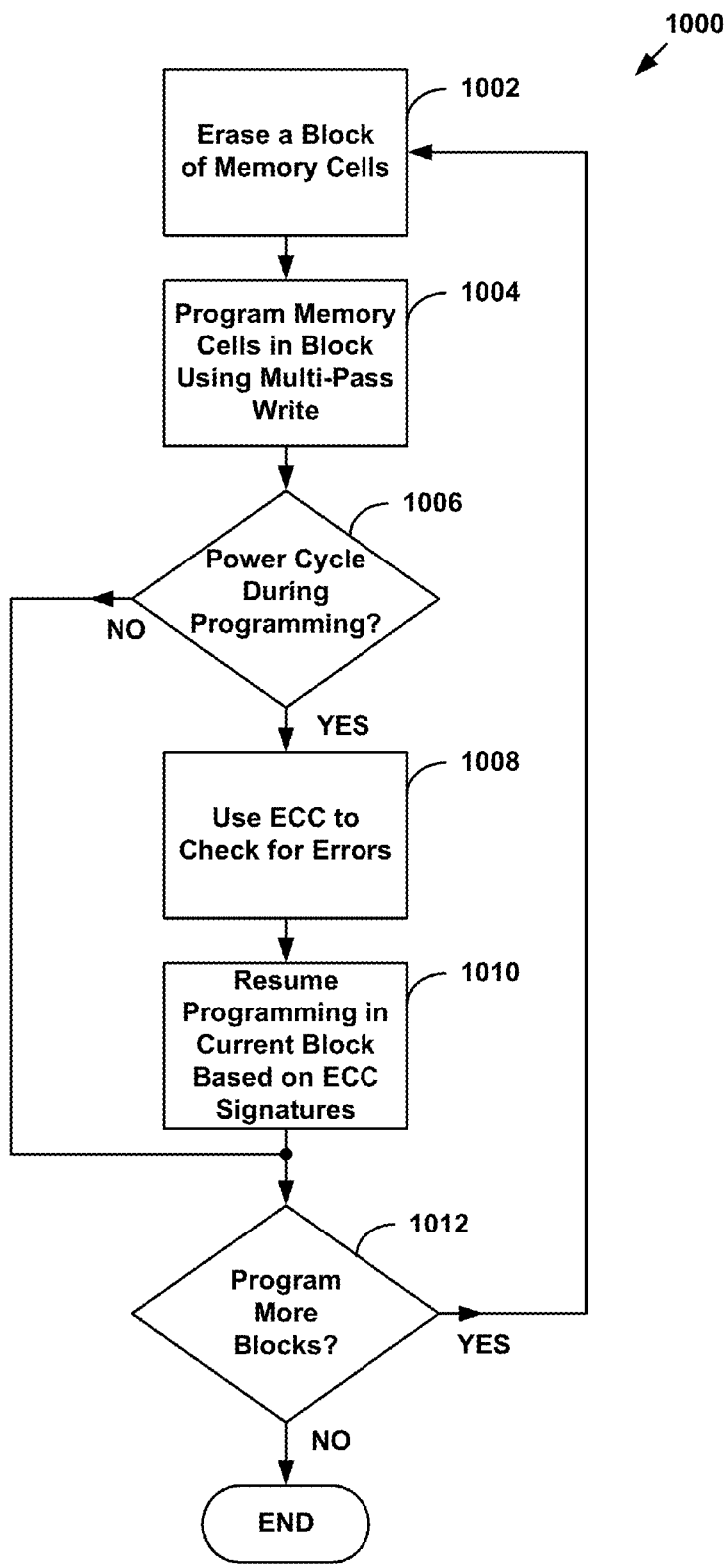
FIG. 10 is a flowchart describing an embodiment of a process for programming non-volatile storage elements.

FIG. 10 is a flowchart describing an embodiment of a process 1000 for programming non-volatile storage elements. In an embodiment, process 1000 may be performed by a non-volatile storage system, such as non-volatile storage system 500 of FIG. 5.

In step 1002, a block of memory cells is erased. In an embodiment, the memory cells of a block are erasable together and accessible by a group of word lines. In an embodiment, the memory cells are MLC memory cells. In an embodiment, the memory cells are 3-bit (D3) memory cells.

In step 1004, the block of memory cells is programmed using multi-pass programming. In an example embodiment, the block of memory cells is programmed using a combination of an LM-Foggy-Double Fine programming technique and non-sequential word line programming order, such as described above in connection with FIGS. 7B-7E and 8A-8B.

In step 1006, a test is made to determine if a power cycle occurred during programming, resulting in a partially programmed block. If a power cycle occurred during programming, at step 1008 ECC are used to check for errors In step 1010, the memory system initializes to resume programming on the current block based on predetermined ECC read status patterns in the block.

If at step 1006 a power cycle did not occur during programming, or after step 1010 completes, the process proceeds to step 1012 to determine if more blocks are to be programmed. If more blocks are to be programmed, the process returns to step 1002. Alternative, if no more blocks are to be programmed, the process ends.

Figure 11:
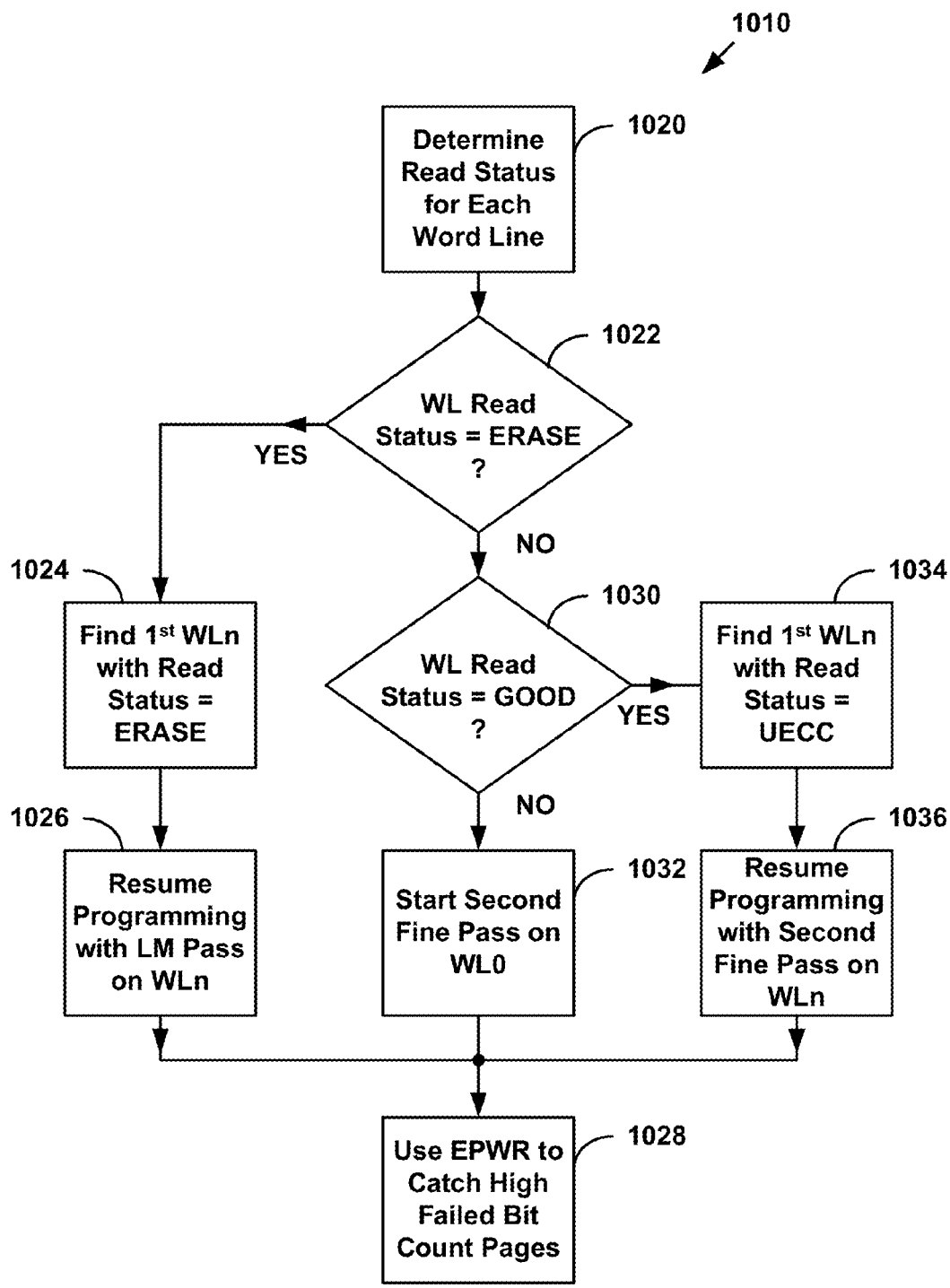
FIG. 11 is a flowchart describing an embodiment of a process for resuming programming of non-volatile storage elements in a partially programmed block.

FIG. 11 is a flowchart describing an embodiment of step 1010 of FIG. 10, in which the memory system initializes to resume programming on the current block based on predetermined ECC read status patterns in the block.

In step 1020, the ECC read status associated with each word line in the partially programmed block is determined. For example, FIGS. 9A-9C depict example word line status and associated ECC read status for a programming block in various scenarios.

In step 1022, a determination is made whether the partially programmed block includes a first predetermined ECC pattern in which at least one word line has an associated ECC read status of ERASE. If so, the power cycle occurred during the first phase of the LM-Foggy-Double Fine programming scheme, with some word lines in the erase state (Case 1, described above in connection with FIG. 9A). For Case 1, the process proceeds to step 1024 and the partially programmed block is scanned to determine the first word line (WLn) having an associated ECC read status ERASE adjacent a word line having an associated ECC read status UECC. In the example of FIG. 9A, the determined WLn=WL5.

At step 1026, programming in the current block resumes with an LM pass on the determined WLn.

At step 1028, an enhanced post-write read process is used to catch high failed bit count pages. Once both program passes are done, data is read back page by page. ECC is done (either entire page or part (e.g., 2k) of a page) to get number of errors. If the errors exceed a certain threshold (e.g., less than the ECC correction capability), the system records it as an EPWR failure. When this happens, data is refolded from source D1 blocks to a new D3 block. EPWR can be done either after all the word lines are programmed or on a rolling basis (e.g., after every few WLs).

At step 1022, if no word lines in the partially programmed block have an associated ECC read status of ERASE, the process proceeds to step 1030, and a determination is made whether the partially programmed block includes a second predetermined ECC read status pattern in which at least one word line has an associated ECC read status of GOOD. If not, the partially programmed block includes a third predetermined ECC read status pattern in which all of the word lines have an associated ECC read status of UECC. If so, the power cycle occurred during the first phase of the LM- Foggy-Double Fine programming scheme, with no word lines in the erase state (Case 2 described above in connection with FIGS. 9B1-9B3).

For Case 2, the process proceeds to step 1032, and programming in the current block resumes with a Second Fine pass on the first word line (e.g., WL0 in FIGS. 9B1-9B3). Following step 1032, the process proceeds to step 1028, and an enhanced post-write read process is used to catch high failed bit count pages.

At step 1030, if the partially programmed block includes a second predetermined ECC read status pattern in which at least one word line has an associated ECC read status of GOOD, the process proceeds to step 1034. In this instance, the power cycle occurred during the second phase of the LM-Foggy-Double Fine programming scheme, and before the second phase is completed for all word lines (Case 3 described above in connection with FIG. 9C).

For Case 3, the partially programmed block is scanned to determine the first word line (WLn) having an associated ECC read status UECC adjacent a word line having an associated ECC read status GOOD. In the example of FIG. 9C, the determined WLn=WL126.

At step 1036, programming in the current block resumes with a Second Fine pass on WLn. In the example of FIG. 9C, WLn=WL126.

The process then proceeds to step 1028, and an enhanced post-write read process is used to catch high failed bit count pages.

Figure 12:
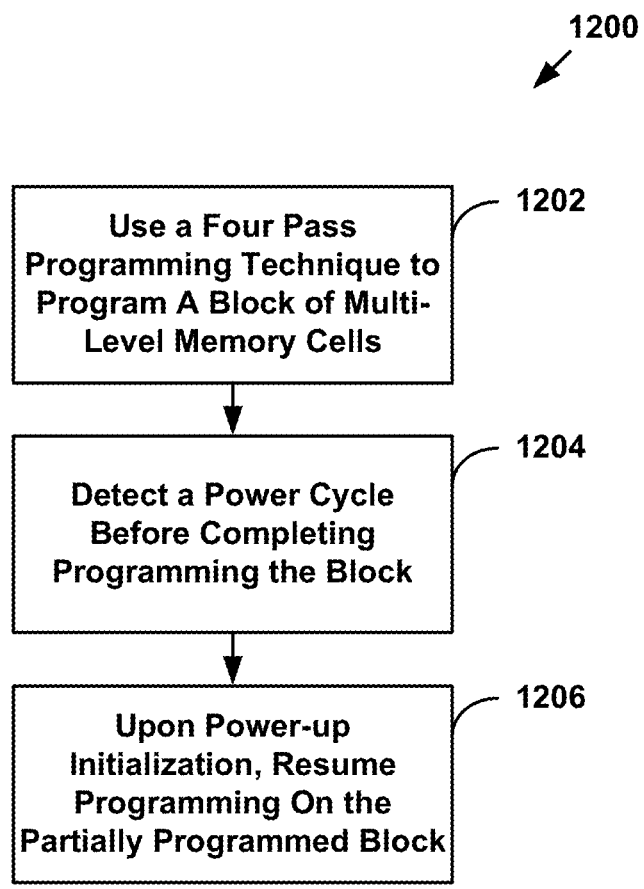
FIG. 12 is a flowchart describing another embodiment of a process for programming non-volatile storage elements.

FIG. 12 is a flowchart describing an embodiment of a process 1200 for programming non-volatile storage elements. In an embodiment, process 1000 may be performed by a non-volatile storage system, such as non-volatile storage system 500 of FIG. 5.

In step 1202, a four-pass programming technique is used to program a block of MLC memory cells. For example, in an embodiment, the LM-Foggy-Double Fine technique described above in connection with FIGS. 7B-7E and FIGS. 8A-8B may be used to program a block of 3-bit (D3) memory cells. Persons of ordinary skill in the art will understand that other four-pass programming techniques may be used, and/or memory cells having more or less than 3 bits/cell may be used.

In step 1204, a power cycle is detected before the block is completely programmed. For example, controller 504 of FIG. 5 may detect a power cycle occurred while programming the block, prior to completing programming the block.

In step 1206, upon power up initialization, programming resumes on the partially programmed block. For example, the memory system may resume programming on the current block based on predetermined ECC read status patterns in the block, such as described above in connection with FIG. 11. Persons of ordinary skill in the art will understand that other techniques may be used to resume programming in the partially programmed block.

One embodiment of the disclosed technology includes a method for programming multi-level non-volatile memory cells, the multi-level non-volatile memory cells accessible by a plurality of word lines. The method includes using a four-pass programming technique to program a block of the multi-level non-volatile memory cells, detecting a power cycle before completing programming of the block of the multi-level non-volatile memory cells, and upon power-up initialization, resuming programming on the block of the multi-level non-volatile memory cells.

One embodiment of the disclosed technology includes a non-volatile memory including an array of multi-level memory cells organized into blocks wherein memory cells of each block are erasable together and are accessible by a plurality of word lines, and a controller. The controller operates a program operation including using a four-pass programming technique to program a block of the multi-level memory cells, detecting a power cycle before completing programming of the block of the multi-level memory cells, and upon power-up initialization, resuming programming on the block of the multi-level memory cells.

One embodiment of the disclosed technology includes a method for use with three-bit non-volatile memory cells, the multi-level non-volatile memory cells accessible by a plurality of word lines. The method includes detecting a power cycle before completing a four-pass programming of a block of the three-bit non-volatile memory cells, and upon power-up initialization, resuming four-pass programming on the block of the multi-level non-volatile memory cells.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method for programming multi-level non-volatile memory cells, the multi-level non-volatile memory cells accessible by a plurality of word lines, the method comprising:

using a four-pass programming technique to program a block of the multi-level non-volatile memory cells;

detecting a power cycle before completing programming of the block of the multi-level non-volatile memory cells; and upon power-up initialization, resuming programming on the block of the multi-level non-volatile memory cells by determining an error correction code read status associated with each word line in the block.

2. The method of claim 1, wherein the multi-level non-volatile memory cells comprise three-bit memory cells.

3. The method of claim 1, wherein each of the multi-level non-volatile memory cells stores a lower page data, a middle page data and an upper page data.

4. The method of claim 3, wherein the four-pass programming technique comprises a first programming pass that is a function only of lower page data, and second through fourth programming passes that are a function of lower page data, middle page data and upper page data.

5. The method of claim 1, wherein the four-pass programming technique comprises a first phase and a second phase, wherein the first phase comprises a non-sequential word line programming order, and the second phase comprises a sequential word line programming order.

6. The method of claim 1, wherein resuming programming on the block of the multi-level non-volatile memory cells comprises resuming programming based on predetermined error correction code read status patterns in the block.

7. The method of claim 1, wherein resuming programming on the block of the multi-level non-volatile memory cells comprises determining if (a) some of the multi-level non-volatile memory cells in the block are in an erase state, (b) all of the multi-level non-volatile memory cells in the block are in an invalid data state, and (c) some of the multi-level non-volatile memory cells in the block are in a valid data state.

8. The method of claim 7, wherein:
if some of the multi-level non-volatile memory cells in the block are in an erase state, resuming programming on the block of the multi-level non-volatile memory cells comprises:
   determining a word line having non-volatile memory cells in the block in an erase state adjacent a word line having non-volatile memory cells in the block in a data invalid state; and
   resuming programming on the determined word line with a first programming pass;
if all of the multi-level non-volatile memory cells in the block are in an invalid data state, resuming programming on the block of the multi-level non-volatile memory cells comprises:
   resuming programming on a first word line in the current block with a fourth programming pass ; and
if some of the multi-level non-volatile memory cells in the block are in a valid data state, resuming programming on the block of the multi-level non-volatile memory cells comprises:
   determining a word line having non-volatile memory cells in the block in a data invalid state adjacent a word line having non-volatile memory cells in the block in a data valid state; and
   resuming programming on the determined word line with the fourth programming pass.

9. A non-volatile memory comprising:
an array of multi-level memory cells organized into blocks wherein memory cells of each block are erasable together and are accessible by a plurality of word lines; and
a controller for operating a program operation comprising:
   using a four-pass programming technique to program a block of the multi-level memory cells;
   detecting a power cycle before completing programming of the block of the multi-level memory cells; and
   upon power-up initialization, resuming programming on the block of the multi-level memory cells by determining an error correction code read status associated with each word line in the block.

10. The non-volatile memory of claim 9, wherein the multi-level memory cells comprise three-bit memory cells.

11. The non-volatile memory of claim 9, wherein each of the multi-level memory cells stores a lower page data, a middle page data and an upper page data.

12. The non-volatile memory of claim 11, wherein the four-pass programming technique comprises a first programming pass that is a function only of lower page data, and second through fourth programming passes that are a function of lower page data, middle page data and upper page data.

13. The non-volatile memory of claim 9, wherein the four-pass programming technique comprises a first phase and a second phase, wherein the first phase comprises a non-sequential word line programming order, and the second phase comprises a sequential word line programming order.

14. The non-volatile memory of claim 9, wherein resuming programming on the block of the multi-level non-volatile memory cells comprises resuming programming based on predetermined error correction code read status patterns in the block.

15. The non-volatile memory of claim 9, wherein resuming programming on the block of the multi-level non-volatile memory cells comprises determining if (a) some of the multi-level non-volatile memory cells in the block are in an erase state, (b) all of the multi-level non-volatile memory cells in the block are in an invalid data state, and (c) some of the multi-level non-volatile memory cells in the block are in a valid data state.

16. The non-volatile memory of claim 15, wherein:
if some of the multi-level non-volatile memory cells in the block are in an erase state, resuming programming on the block of the multi-level non-volatile memory cells comprises:
   determining a word line having non-volatile memory cells in the block in an erase state adjacent a word line having non-volatile memory cells in the block in a data invalid state; and
   resuming programming on the determined word line with a first programming pass;
if all of the multi-level non-volatile memory cells in the block are in an invalid data state, resuming programming on the block of the multi-level non-volatile memory cells comprises:
   resuming programming on a first word line in the current block with a fourth programming pass ; and
if some of the multi-level non-volatile memory cells in the block are in a valid data state, resuming programming on the block of the multi-level non-volatile memory cells comprises:
   determining a word line having non-volatile memory cells in the block in a data invalid state adjacent a word line having non-volatile memory cells in the block in a data valid state; and
   resuming programming on the determined word line with the fourth programming pass.

17. A method for use with three-bit non-volatile memory cells, the three-bit non-volatile memory cells accessible by a plurality of word lines, the method comprising:
detecting a power cycle before completing a four-pass programming of a block of the three-bit non-volatile memory cells; and
upon power-up initialization, resuming four-pass programming on the block of the three-bit non-volatile memory cells by:
   determining if (a) some of the three-bit non-volatile memory cells in the block are in an erase state, (b) all of the three-bit non-volatile memory cells in the block are in an invalid data state, and (c) some of the three-bit non-volatile memory cells in the block are in a valid data state.

18. The method of claim 17, wherein:
- each of the three-bit non-volatile memory cells stores a lower page data, a middle page data and an upper page data; and
- four-pass programming comprises a first programming pass that is a function only of lower page data, and second through fourth programming passes that are a function of lower page data, middle page data and upper page data.

19. The method of claim 17, wherein four-pass programming technique comprises a first phase and a second phase, wherein the first phase comprises a non-sequential word line programming order, and the second phase comprises a sequential word line programming order.

20. The method of claim 17, wherein:
- if some of the three-bit non-volatile memory cells in the block are in an erase state, resuming four-pass programming on the block of the multi-level non-volatile memory cells comprises:
  - determining a word line having non-volatile memory cells in the block in an erase state adjacent a word line having non-volatile memory cells in the block in a data invalid state; and
  - resuming four-pass programming on the determined word line with a first programming pass;
- if all of the three-bit non-volatile memory cells in the block are in an invalid data state, resuming four-pass programming on the block of the multi-level non-volatile memory cells:
  - resuming four-pass programming on a first word line in the current block with a fourth programming pass ; and
- if some of the three-bit non-volatile memory cells in the block are in a valid data state, resuming four-pass programming on the block of the multi-level non-volatile memory cells:
  - determining a word line having non-volatile memory cells in the block in a data invalid state adjacent a word line having non-volatile memory cells in the block in a data valid state; and
  - resuming four-pass programming on the determined word line with the fourth programming pass.

* * * * *